United States Patent [19]

Hawton, Jr. et al.

[11] 4,179,351
[45] Dec. 18, 1979

[54] CYLINDRICAL MAGNETRON SPUTTERING SOURCE

[75] Inventors: John T. Hawton, Jr.; William G. Shumate, both of Colorado Springs, Colo.

[73] Assignee: Hewlett-Packard Company, Palo Alto, Calif.

[21] Appl. No.: 721,740

[22] Filed: Sep. 9, 1976

[51] Int. Cl.² ............................................. C23C 15/00
[52] U.S. Cl. ................................................ 204/298
[58] Field of Search .............................. 204/192, 298

[56] References Cited

U.S. PATENT DOCUMENTS

| | | | |
|---|---|---|---|
| 3,354,074 | 11/1967 | Kay | 204/298 |
| 3,884,793 | 5/1975 | Penfold et al. | 204/298 |
| 3,998,718 | 12/1976 | Melliar-Smith | 204/298 |
| 4,041,353 | 8/1977 | Penfold et al. | 315/267 |

OTHER PUBLICATIONS

R. J. Hecht et al., *J. Vac. Sci Tech.*, vol. 12, No. 4, Jul.-/Aug. 1975, pp. 836-841.

*Primary Examiner*—Aaron Weisstuch
*Attorney, Agent, or Firm*—Michael L. Sherrard

[57] ABSTRACT

Placement of cylindrical magnets inside of a cylindrical cathode comprising a source of depositing material for sputter depositing of the material upon the interior surface of a substantially cylindrical workpiece, results in improved deposition rates, low power requirements, low workpiece temperatures and purity and cohesiveness in the deposited layer of material.

7 Claims, 3 Drawing Figures

CYLINDRICAL MAGNETRON SPUTTERING SOURCE

BACKGROUND OF THE INVENTION

The prior art method of coating aluminum upon the interior surface of a glass funnel used in the manufacture of cathode ray tubes involves the resistance heating of a tungsten coil in which a small amount of aluminum is placed. As the tungsten heats, the aluminum melts, then vaporizes so as to deposit upon the workpiece. However, the tungsten coil reacts with the aluminum, degrading the purity of the aluminum deposit and also degrading the tungsten coils and requiring their periodic replacement at a substantial cost. In addition, this method typically results in areas of thinly deposited aluminum corresponding to the shadows of the electrodes connecting the resistive coil to a source of electronic potential.

Cathode sputtering is a method used in the application of thin films of materials upon planar substrates. This process involves the generation of positively charged ions in an evacuated chamber. The positively charged ions bombard a cathode comprising a source of depositing material with sufficient energy to physically eject material from the cathode surface. The material thus ejected from the cathode, most of which is neutrally charged, diffuses across the evacuated chamber and subsequently condenses upon the substrate to form the desired deposited layer. This process is further described in U.S. Pat. No. 2,146,025 issued to Penning on Feb. 7, 1939, U.S. Pat. No. 3,282,816 issued to Kay on Nov. 1, 1966, U.S. Pat. No. 3,616,450 issued to Clarke on Oct. 26, 1971, U.S. Pat. No. 3,711,398 issued on Jan. 16, 1973, also to Clarke, and U.S. Pat. No. 3,878,085 issued to Corbani on Apr. 15, 1975.

These patents describe a wide variety of geometries for planar magnetrons characterized by the use of a magnetic field for concentrating the electron density near the cathode, but all are restricted to configurations adapted to the deposition of material upon planar surfaces. Penning shows a solid cathode with a magnet exterior to the workpiece. This is inefficient in the use of the magnetic field, is especially inefficient when used in large structures, and is not adaptable to providing a variable magnetic field along the axis of the cathode for control of the deposition rate along the axis of the magnetron.

Kay has reversed the cathode/anode geometry to better adapt the magnetron to sputtering upon planar surfaces. Clark, Clark, and Corbani illustrate further refinements in the adaption of a magnetron to sputtering upon planar surfaces.

The prior art is insufficient for the efficient sputter depositing upon the interior surface of a CRT tube because it is not adaptable to deposition upon the interior surface of a cylindrical workpiece. Further, the prior art does not provide for an efficient use of the magnetic field in applications to larger structures and does not teach a way of controlling the uniformity of the deposition along the magnetron axis for applications to workpieces non-symmetrical along the magnetrons axis of symmetry.

It is therefore the principal object of the present invention to provide a sputtering apparatus for the efficient deposition of a material upon the interior surface of a substantially cylindrical workpiece.

It is further object of the present invention to provide a magnetron whereby electrons and charged ions are effectively confined to a volume proximate to the cathode by a magnetic field wherein the magnets producing the magnetic fields are placed in close proximity with the cathode surface, allowing smaller magnets to provide the required field in larger structures.

It if a further object of the present invention to provide a magnetron wherein the magnetic fields proximate to the cathode surface are variable so as to allow control of the deposition rate upon the surface of workpieces that are substantially non-cylindrical.

It is further object of the present invention to provide a device whereby the functions of cathode, material source, support and coolant retention are performed by a single element.

SUMMARY OF THE INVENTION

The above mentioned objects are accomplished in the preferred embodiment by placing a cylindrical cathode comprising a material desired to be deposited upon the interior surface of a substantially cylindrical workpiece within such workpiece. Within the cylindrical cathode are cylindrical magnets oriented symmetrically about the axis of the cylinder for generating toroidal magnetic fields tending to restrict charged particles to a volume proximate to the cylindrical cathode. Within the cylindrical cathode also exists a pipeline for introducing a coolant, the coolant being confined by the interior surface of the cylindrical cathode and removed by exit from a second pipeline with the cylindrical cathode. The cathode, an anode, and the interior surface of the workpiece are contained within an evacuated volume composed primarily of an inert gas characterized by its tendency not to react with the workpiece, cathode or anode and further characterized by its susceptibility to ionization during plasma discharge. The anode is held at a potential sufficient to initiate and sustain the required plasma discharge whereupon the torodial magnetic fields generated by the cylindrical magnets tend to concentrate the free electrons, and thus the generation of positive ions, proximate to the cylindrical cathode. This increases the rate of ion generation and ion bombardment upon the cylindrical cathode, resulting in an increased sputtering rate as well as lower power consumption resulting from the tendency of the electrons to flow around the cylindrical cathode due to the influence of the magnetic field rather than flowing directly to the anode.

PREFERRED EMBODIMENT OF THE INVENTION

Figure 1:
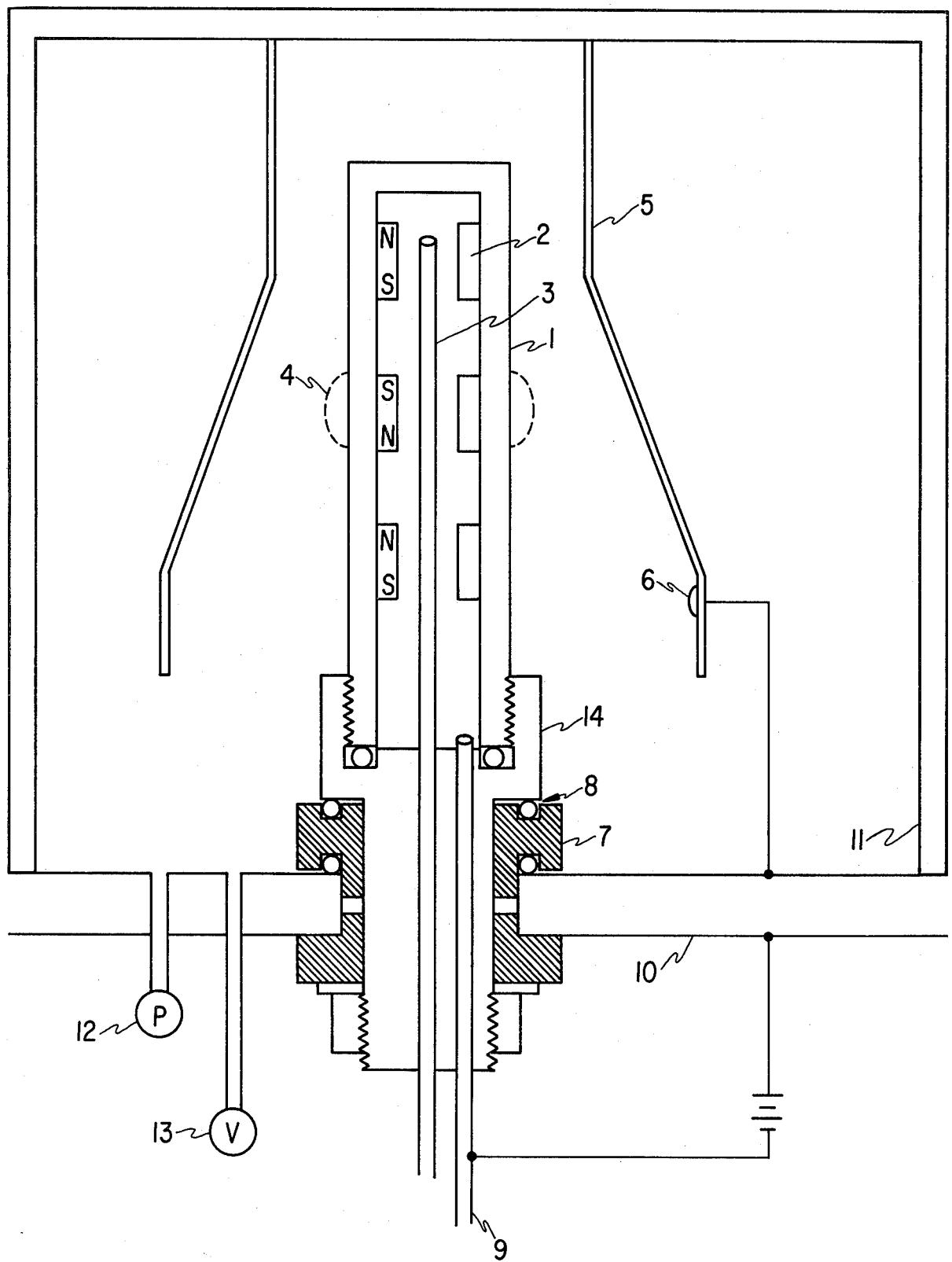
FIG. 1 is a detailed illustration of a cylindrical cathode designed in accordance with the present invention.

Referring to FIG. 1, a cylindrical cathode 1 is formed from a section of aluminum tubing. A multiplicity of cylindrical permanent magnets 2 are fit within the cylindrical cathode 1 and spaced at two inch centers with an axis of symmetry common to that of the cylinder. A water cooling tube 3 is inserted through the centers of the magnets to provide an exit for cooling water. An electrically conductive inlet water tube 9 is terminated near the base of a flange 14 to which the inlet water tube 9 is attached and by which the inlet water tube 9 is maintained in electrical contact with the cylindrical cathode 1 for purposes of applying a negative electrical potential to the cylindrical cathode 1. The cylindrical cathode 1 and a workpiece 5 are positioned within an evacuated chamber composed of a bell jar 11 and base plate 10 which is evacuated to a pressure of about $1 \times 10^{-3}$ torr by a vacuum pump 12. An insulator 7 electrically insulates the base plate 10 from the cylindrical cathode 1, flange 14, and inlet water tube 9. Cathode 1 is threaded at its base for mechanical coupling to flange 14 containing coolant tubes 3 and 9.

Upon application of a potential of approximately 500 V between the cylindrical cathode 1 and the base plate 10, which acts as an anode, a plasma discharge is produced between the cylindrical cathode 1 and the base plate 10. A person skilled in the art will realize that a wide range of voltages will be workable in the present invention, from 25-25,000 volts A.C. or D.C., to create free electrons flowing from the cylindrical cathode 1, which collide with gas molecules in the chamber, such as Argon, and to ionize the gas. The positively charged gas ions are then attracted to the cylindrical cathode 1 and attain sufficient energy to eject by momentum transfer a small portion of the aluminum cathode upon impact. The neutral aluminum molecules thus physically ejected then diffuse within the chamber and condense upon the interior surface of the workpiece 5.

The cylindrical permanent magnets 2 produce a magnetic field characterized by magnetic field lines 4 symmetrical about the central axis of the cylindrical cathode 1. When a charged particle, such as an electron or positive Argon ion, attempts to cross a magnetic field line it is accelerated in a direction perpendicular to its velocity and to the field line as described by the relation:

$$\vec{F} = -q\,(\vec{V} \times \mu_0 \vec{H})$$

Figure 2:
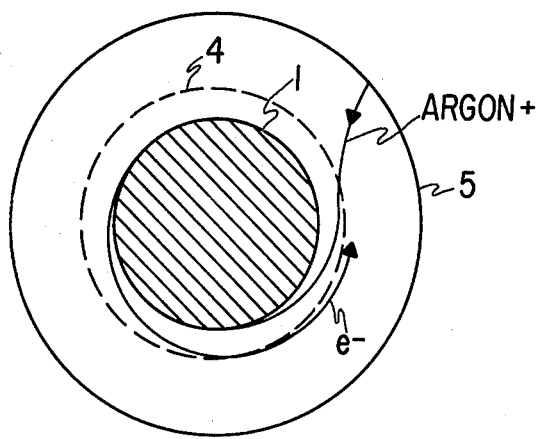
FIG. 2 is a top view of the cylindrical cathode of FIG. 1 illustrating the tracks of charged particles due to the influence of the magnetic field.

This results in a tendency for electrons and positive Argon ions to circle the cylindrical cathode 1 as illustrated in FIG. 2, without crossing the magnetic field lines 4, increasing the concentration of electrons and ions near the cylindrical cathode 1. This results in a high rate of ion generation and a low discharge current.

Argon is used in the preferred embodiment as the inert gas filling the chamber but any gas exhibiting inert characteristics, i.e. not tending to deposit upon or react with cathode, anode or workpiece, which is easily ionizable and can attain sufficient energy to vaporize the cathode material would be suitable.

The pressure of the chamber should be such that plasma discharge is encouraged. Typically pressures of $1 \times 10^{-4}$ to $1 \times 10^{-1}$ torr are characterized by a very high tendency toward corona or plasma discharge, i.e. a low voltage is required to ionize gases in this pressure range.

Aluminum is used in the preferred embodiment but as would be obvious to a skilled mechanic any conductive, resistive, dielectric or semiconductor material could be deposited utilizing the present invention.

For reactive sputtering of dielectric materials the applied voltage is typically a radio frequency of approximately 13.5 MHz. An aluminum cathode and a partial pressure of $O_2$ in the Argon during sputtering would result in a deposition of aluminum oxide ($4Al + 3O_2 \rightarrow 2Al_2O_3$) upon the workpiece. The periodic negative voltage on the cathode will serve to neutralize the charge of the dielectric aluminum oxide which deposits upon the cathode.

A single bar magnet could be inserted into the cylindrical cathode 1 to generate a single magnetic field in place of the multiple magnetic fields generated by the cylindrical permanent magnets 2, except that it would be difficult to obtain a sufficient magnetic field intensity with a single bar magnet placed along the center line of the cylindrical cathode. Similarily, an electromagnet would be functional for conditions where a variable field would be desired in place of the permanent cylindrical magnets 2 employed in the preferred embodiment of the present invention, or where a stronger field than that obtainable from permanent magnets is desired. The preferred embodiment of the present invention utilizes magnetized ion bar stock to form cylindrical permanent magnets 2 to obtain a typical field of from 800-1000 gauss. However, multiple permanent magnets have the advantage of producing more than one toroidal volume or particle "racetrack", in which charged particles are concentrated. This results in multiple erosion zones, each zone centered upon the center of a magnet, rather than a single erosion zone as would be obtained from a single magnetic field. In addition to the cost advantage which permanent magnets have over electromagnets, the use of multiple magnets further provides for modification of the deposition rates from the surface of the cathode as a function of the position along the axis of the cathode by varying the strength of the magnetic field and spacing of the magnets along the axis of the cylindrical cathode 1. This is especially advantageous where the workpiece, such as a CRT funnel, is non-cylindrical. By increasing the magnetic field an increased deposition rate can be achieved upon the more distant surfaces and a uniform deposition layer can be achieved upon the non-cylindrical workpiece.

A second method for controlling the deposition rate along the axis of the cathode is by varying the shape of the cathode from a nominal cylindrical shape. By enlarging the cathode at a certain point so as to include a tapered conical section and by maintaining a suitable magnetic field of the surface of the cathode the increased area on the cathode would result in an increased rate of deposition. For example, the present invention could be built such that cathode walls were substantially parallel to the interior surface of the workpiece.

Figure 3:
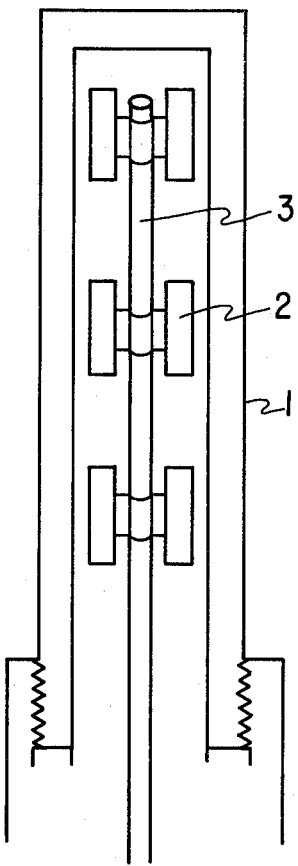
FIG. 3 is a detailed illustration of a cylindrical cathode showing an alternative method for attaching the cylindrical permanent magnets.

An alternative method for attaching the cylindrical permanent magnets 2 would involve a platform as illustrated in FIG. 3 whereby the cylindrical permanent magnets 2 are suspended from the water cooling tube 3, but still held close to the cylindrical cathode 1. Such a configuration is advantageous when significant cathode erosion requires the frequent replacement of the cathode in that all that is required is for the aluminum cathode be unscrewed and a replacement screwed in.

In the preferred embodiment of the present invention an anode 6 is electrically attached to the base plate 10. As the initial deposit of aluminum has been made upon the workpiece 5, the base plate 10 is thereby brought into electrical contact with the deposited layer of aluminum. Thereby the entire deposition layer acts as an anode and no shadow results as would be required by a separate anode.

We claim:

1. A magnetron sputtering source comprising:

a cathode having a face of material to be sputtered, having a hollow interior, and having base and end regions;

means for circulating a coolant within said cathode comprising a first coolant tube within said cathode extending from the base region to substantially the end region of said cathode and forming a first fluid conduit for the flow of coolant throughout the interior of said cathode, and comprising means forming a second fluid conduit for the flow of coolant throughout the interior of said cathode terminating near the base region of said cathode;

a magnet within the hollow interior of said cathode for the generation of a magnetic field proximate to the outer surface of said cathode for concentrating charged particles proximate to said cathode, said magnet mounted to said first coolant tube whereby said cathode can be replaced without disturbing said first coolant tube or said magnet; and means providing an electrical connection to said cathode.

2. A magnetron sputtering source as in claim 1 further comprising multiple magnets within the hollow interior of said cathode having selected magnet field strengths and having selected spacings therebetween for generating a magnetic field varying in strength along said cathode.

3. A magnetron sputtering source as in claim 2 wherein:
said cathode is substantially cylindrical;
said magnets are substantially cylindrical; and
said magnets are oriented symmetrically about the axis of symmetry of said cathode.

4. A magnetron sputtering source as in claim 1 wherein:
said cathode further comprises a tapered conical section;
said magnet is substantially cylindrical; and
said magnet is oriented symmetrically about the axis of symmetry of said cathode.

5. A magnetron sputtering system as in claim 4 further comprising:
means for evacuating a volume between said cathode and a workpiece;
an anode within the evacuated volume;
means for applying an electric potential between said cathode and said anode; and
means for providing an inert gas within said evacuated volume at a partial pressure between $1 \times 10^{-4}$ and $1 \times 10^{-1}$ torr.

6. A magnetron sputtering source as in claim 1 wherein said cathode is substantially cylindrical, said magnet is substantially cylindrical, and said magnet is oriented symmetrically about the axis of symmetry of said cathode.

7. A magnetron sputtering source as in 1 wherein the base region of said cathode is threaded for mechanically coupling to a structure mechanically coupled to said means for circulating a coolant whereby said cathode can be replaced without disturbing said first coolant tube or said magnet.

* * * * *